(12) United States Patent
Cai

(10) Patent No.: US 11,398,561 B2
(45) Date of Patent: Jul. 26, 2022

(54) METHOD FOR MANUFACTURING TRENCH MOSFET

(71) Applicant: Hangzhou Silicon-Magic Semiconductor Technology Co., Ltd., Hangzhou (CN)

(72) Inventor: Jinyong Cai, Hangzhou (CN)

(73) Assignee: HANGZHOU SILICON-MAGIC SEMICONDUCTOR TECHNOLOGY CO., LTD., Zhe Jiang Province (CN)

( * ) Notice: Subject to any disclaimer, the term of this patent is extended or adjusted under 35 U.S.C. 154(b) by 85 days.

(21) Appl. No.: 16/853,920

(22) Filed: Apr. 21, 2020

(65) Prior Publication Data

US 2020/0343370 A1    Oct. 29, 2020

(30) Foreign Application Priority Data

Apr. 28, 2019 (CN) .......................... 201910347466.1

(51) Int. Cl.
| | |
|---|---|
| *H01L 29/66* | (2006.01) |
| *H01L 21/02* | (2006.01) |
| *H01L 21/3105* | (2006.01) |
| *H01L 21/311* | (2006.01) |
| *H01L 21/3213* | (2006.01) |

(Continued)

(52) U.S. Cl.
CPC .. *H01L 29/66734* (2013.01); *H01L 21/02126* (2013.01); *H01L 21/02274* (2013.01); *H01L 21/31053* (2013.01); *H01L 21/31116* (2013.01); *H01L 21/32133* (2013.01); *H01L 29/0865* (2013.01); *H01L 29/1095* (2013.01); *H01L 29/407* (2013.01); *H01L 29/41741* (2013.01); *H01L 29/4916* (2013.01); *H01L 29/7813* (2013.01)

(58) Field of Classification Search
CPC ......... H01L 29/66734; H01L 21/02126; H01L 21/02274; H01L 21/31053; H01L 21/31116; H01L 21/32133; H01L 29/0865; H01L 29/1095; H01L 29/407; H01L 21/823864; H01L 21/823487
See application file for complete search history.

(56) References Cited

U.S. PATENT DOCUMENTS

| | | |
|---|---|---|
| 5,578,841 A | 11/1996 | Vasquez et al. |
| 7,648,877 B2 | 1/2010 | Andrews |

(Continued)

FOREIGN PATENT DOCUMENTS

CN          101740395 A       6/2010

*Primary Examiner* — Julio J Maldonado
*Assistant Examiner* — Andre C Stevenson
(74) *Attorney, Agent, or Firm* — Alston & Bird LLP

(57) ABSTRACT

A MOSFET is made by: forming a trench extending from an upper surface of a base layer to an internal portion of the base layer; forming a first insulating layer and a shield conductor occupying a lower portion of the trench; forming a gate dielectric layer and a gate conductor occupying an upper portion of the trench, where a top surface of the gate conductor is lower than the upper surface of the base layer; and before forming a body region, forming a blocking region on a region of the top surface of the gate conductor adjacent to sidewalls of the trench to prevent impurities from being implanted into the base layer from the sidewalls of the trench during subsequent ion implantation.

19 Claims, 11 Drawing Sheets

(51) Int. Cl.
*H01L 29/08* (2006.01)
*H01L 29/10* (2006.01)
*H01L 29/40* (2006.01)
*H01L 29/417* (2006.01)
*H01L 29/49* (2006.01)
*H01L 29/78* (2006.01)

(56) References Cited

U.S. PATENT DOCUMENTS

| | | | |
|---|---|---|---|
| 9,018,062 B2 | 4/2015 | Liao | |
| 9,245,977 B2 | 1/2016 | Liao | |
| 9,299,830 B1* | 3/2016 | Kawahara | H01L 29/404 |
| 9,515,153 B2 | 12/2016 | Uchimura | |
| 10,074,743 B2 | 9/2018 | Qin | |
| 10,290,715 B2* | 5/2019 | Cai | H01L 29/407 |
| 2003/0148559 A1 | 8/2003 | Onishi et al. | |
| 2007/0075363 A1 | 4/2007 | Otake et al. | |
| 2007/0114600 A1* | 5/2007 | Hirler | H01L 29/407 257/330 |
| 2009/0166728 A1* | 7/2009 | Pan | H01L 29/7831 257/330 |
| 2011/0133272 A1* | 6/2011 | Mauder | H01L 29/66719 257/335 |
| 2012/0043602 A1 | 2/2012 | Zeng et al. | |
| 2012/0241849 A1 | 9/2012 | Nozu | |
| 2013/0153995 A1* | 6/2013 | Misawa | H01L 29/42368 438/270 |
| 2014/0015039 A1* | 1/2014 | Hossain | H01L 29/7813 257/330 |
| 2015/0076600 A1 | 3/2015 | Jun et al. | |
| 2015/0295080 A1* | 10/2015 | Lee | H01L 29/66727 257/330 |
| 2016/0064478 A1 | 3/2016 | Sun et al. | |
| 2017/0309610 A1 | 10/2017 | Yao et al. | |
| 2018/0212027 A1 | 7/2018 | Cai et al. | |

* cited by examiner

METHOD FOR MANUFACTURING TRENCH MOSFET

RELATED APPLICATIONS

This application claims the benefit of Chinese Patent Application No. 201910347466.1, filed on Apr. 28, 2019, which is incorporated herein by reference in its entirety.

FIELD OF THE INVENTION

The present invention generally relates to the field of semiconductor technology, and more particularly to trench MOSFETs and methods for manufacturing trench MOSFETs.

BACKGROUND

With the development of semiconductor technology, power devices, as an important part of integrated circuits, are widely used in many fields, such as automotive electronics and communication equipment. The commonly used power devices include trench metal-oxide-semiconductor field-effect transistor (MOSFET) devices, planar diffusion MOSFET devices, and the like.

DETAILED DESCRIPTION

Figure 1:
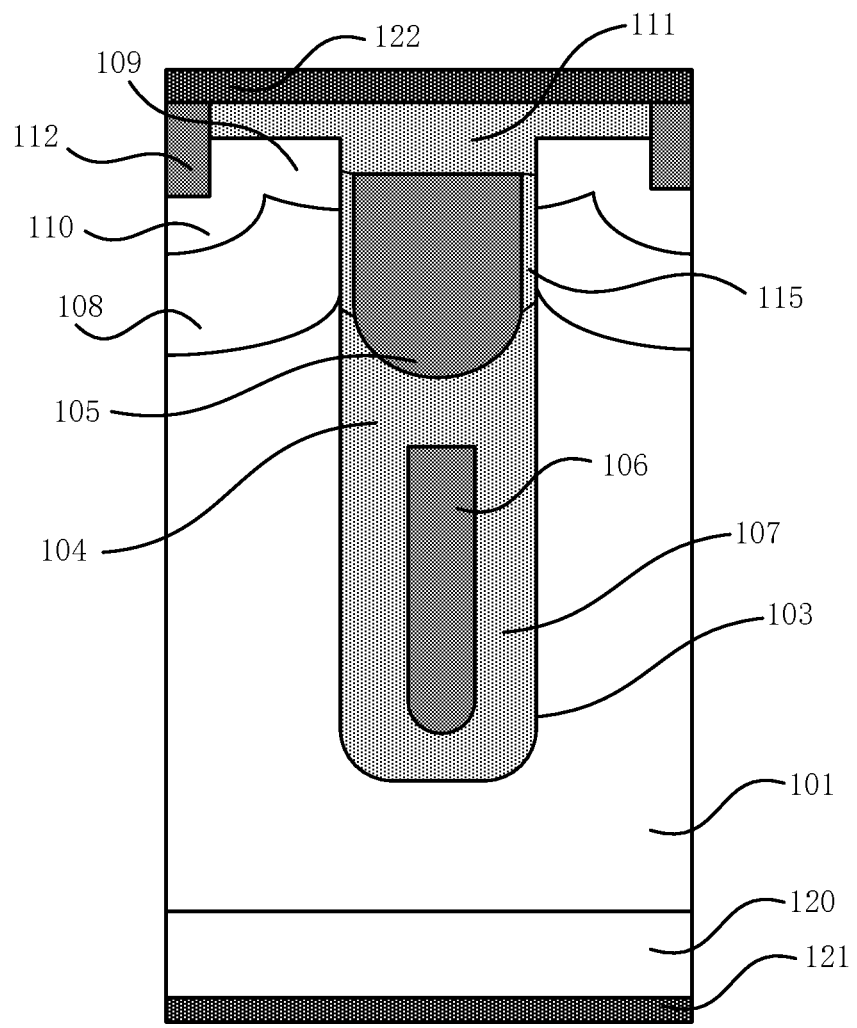
FIG. 1 is a cross-sectional view of an example trench MOSFET, in accordance with embodiments of the present invention.

Reference may now be made in detail to particular embodiments of the invention, examples of which are illustrated in the accompanying drawings. While the invention may be described in conjunction with the preferred embodiments, it may be understood that they are not intended to limit the invention to these embodiments. On the contrary, the invention is intended to cover alternatives, modifications and equivalents that may be included within the spirit and scope of the invention as defined by the appended claims. Furthermore, in the following detailed description of the present invention, numerous specific details are set forth in order to provide a thorough understanding of the present invention. However, it may be readily apparent to one skilled in the art that the present invention may be practiced without these specific details. In other instances, well-known methods, procedures, processes, components, structures, and circuits have not been described in detail so as not to unnecessarily obscure aspects of the present invention.

In some approaches, in order to ensure that there is no residual of gate conductor on the surface of epitaxial layer in the shielded gate trench metal-oxide-semiconductor field-effect transistor (MOSFET) device, the gate conductor in the trench can be generally etched. However, the etching depth of the gate conductor can be different in different positions of the same gate conductor and in different batches of MOSFET device manufacturing. During subsequent ion implantation, impurities can enter the epitaxial layer from the trench sidewall on the top of the gate conductor, which can affect the junction depth of the body region of the MOSFET device. The junction depth of the body region may fluctuate along with the difference in the etching depth of the gate conductor, which can cause threshold voltage Vth of the device and characteristics of gate leakage capacitance Cgd to be greatly affected, and even possibly resulting in a soft breakdown phenomenon. In particular embodiments, a method for manufacturing a trench MOSFET device can solve problems that affect device performance due to differences in gate conductor etch-back depth.

Unless the context clearly indicates otherwise, each part of the semiconductor device can be made of material(s) that are known to those skilled in the art. For example, the semiconductor material may include at least one of a group III-V semiconductor (e.g., GaAs, InP, GaN, and SiC, etc.) and group IV semiconductor (e.g., Si, Ge, etc.). A gate conductor may be made of any conductive material (e.g., metal, doped polysilicon, a stack of metal and doped polysilicon, etc.). For example, the gate conductor may be made of one selected from a group including TaC, TiN, TaSiN, HfSiN, TiSiN, TiCN, TaAlC, TiAlN, TaN, PtSix, Ni 3 Si, Pt, Ru, W, and their combinations. A gate dielectric may be made of SiO2, or any suitable material having dielectric constant greater than that of SiO2. For example, the gate dielectric may be made of one selected from a group including oxides, nitrides, oxynitrides, silicates, aluminates, and titanates. Moreover, the gate dielectric can be made of those developed in the future, besides the above known materials.

As used herein, the term "semiconductor structure" can generally mean the whole semiconductor structure formed at each step of manufacturing of the semiconductor device, including all of the layers and regions having been formed. The term "laterally extending" can mean extending in a direction substantially perpendicular to the depth direction of the trench.

In one embodiment, a method of making a MOSFET, can include: (i) forming a trench extending from an upper surface of a base layer to an internal portion of the base layer; (ii) forming a first insulating layer and a shield conductor occupying a lower portion of the trench; (iii) forming a gate dielectric layer and a gate conductor occupying an upper portion of the trench, where a top surface of the gate conductor is lower than the upper surface of the base layer; and (iv) before forming a body region, forming a blocking region on a region of the top surface of the gate conductor adjacent to sidewalls of the trench to prevent impurities from being implanted into the base layer from the sidewalls of the trench during subsequent ion implantation.

Referring now to FIG. 1, shown is cross-sectional view of an example trench MOSFET, in accordance with embodiments of the present invention. Trench MOSFET device 100 can include a base layer, which can include semiconductor substrate 120 with a first doping type, and epitaxial layer 101 with a second doping type growing on the upper surface of semiconductor substrate 120. In other examples, the base layer may also include a semiconductor substrate, an epitaxial layer, and other semiconductor layers located between the two.

Trench MOSFET device 100 can include trench 103, which can extend from an upper surface of epitaxial layer 101 into its interior portion, and may end inside epitaxial layer 101. That is, a bottom of trench 103 may be separated from semiconductor substrate 120 by epitaxial layer 101. First insulating layer 107 can be formed in the trench, and may be located on lower sidewall surfaces and a bottom surface of the trench. Shield conductor 106 can be filled in the trench having first insulating layer 107. Second insulating layer 104 having a certain shape may be formed on top portion of shield conductor 106 and insulating layer 107. Gate dielectric layer 115 and gate conductor 105 can be formed at an upper portion of the trench. Gate conductor 105 and gate dielectric layer 115 may be located on the top of second insulating layer 104. Gate dielectric layer 115 may be located on the upper surface of the trench. Also, gate dielectric layer 115 can separate gate conductor 105 from epitaxial layer 101. Second insulating layer 104 can separate shield conductor 106 and gate conductor 105. Here, the etching depth of gate conductor 105 may be configured as the distance from the upper surface of epitaxial layer 101 to the top surface of gate conductor 105.

Body region 108 of the second doping type may be formed in an upper region of epitaxial layer 101 adjacent to trench 103. Source region 109 of the first doping type can be formed in body region 108. Body contact region 110 of the second doping type may be formed in the body region 108. After source region 109 is formed, interlayer dielectric layer 111 may be formed on source region 109 and gate conductor 105. Before interlayer dielectric layer 111 is formed, blocking region 114 can be formed on the region of gate conductor 105 near sidewalls of trench 103 and on gate dielectric layer 115 such that the depth of the body region is not affected by the etch-back depth of gate conductor 105. In one example, interlayer dielectric layer 111 may be formed directly on the blocking region.

In trench MOSFET device 100, conductive channel 112 that penetrates interlayer dielectric layer 111 and source region 109 to reach body contact region 110 may be formed adjacent to source region 109. Source electrode 112 can be formed on interlayer dielectric layer 111, and source electrode 112 may be connected to body contact region 110 via conductive channel 112. Drain electrode 121 may be formed on the lower surface of semiconductor substrate 120, where the upper surface of semiconductor substrate 120 is opposite to the lower surface of semiconductor substrate 120. For example, interlayer dielectric layer 111 can be an oxide layer having a specific thickness (e.g., silicon oxide). Here, the second doping type is opposite to the first doping type, where the first doping type is one of N type and P type, and the second doping type is the other one of the N type and P type.

Figure 2A:
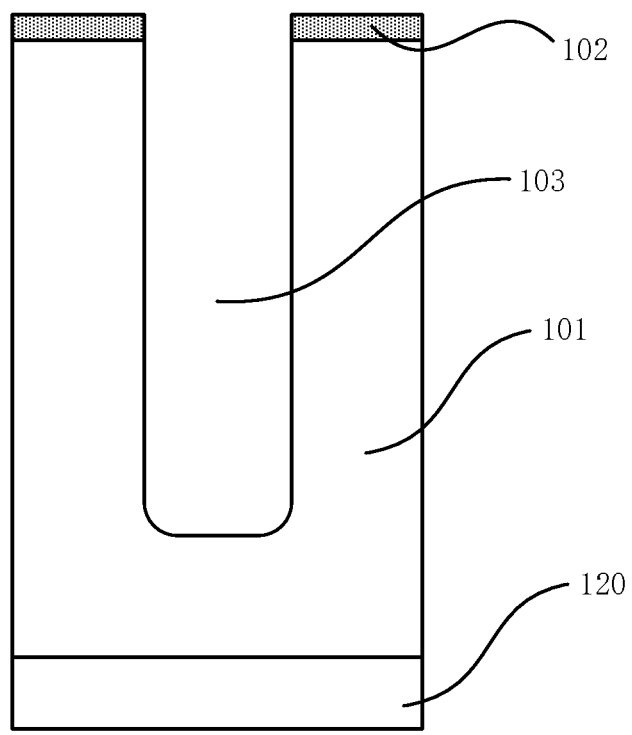
FIGS. 2A-2J are cross-sectional views of formation steps of an example method of manufacturing a trench MOSFET, in accordance with embodiments of the present invention.

Referring now to FIGS. 2A-2J, shown is cross-sectional view of formation steps of an example method of manufacturing a trench MOSFET, in accordance with embodiments of the present invention. In FIG. 2A, epitaxial layer 101 can be formed on semiconductor substrate 120. Oxide layer 102 may be formed on epitaxial layer 101, and using patterned oxide dielectric layer 102 as a mask to etch epitaxial layer 101 to form trench 103. The trench may extend from the upper surface of epitaxial layer 101 into internal portion of epitaxial layer 101. The epitaxial layer can be etched by dry etching (e.g., ion milling etching, plasma etching, reactive ion etching, laser ablation, etc.), or by selective wet etching using an etching solution. A process of etching downward from the opening of the photoresist mask can be performed to form an opening of the oxide layer, whereby the oxide layer is patterned to be configured as a hard mask. The etching can be stopped on the upper surface of epitaxial layer 101 according to the selected etching process. After the hard mask is formed, the photoresist layer may be removed, such as by dissolution in a solvent or ashing process. Epitaxial layer 101 can be further etched by the above-described etching process using the hard mask to form trench 103 in epitaxial layer 101. For example, the depth of the trench can be controlled by controlling the etching time. In the example of FIG. 2A, the trench may end inside epitaxial layer 101. After the trench is formed, the hard mask can be removed relative to the epitaxial semiconductor layer, such as by a selective etchant.

Figure 2B:
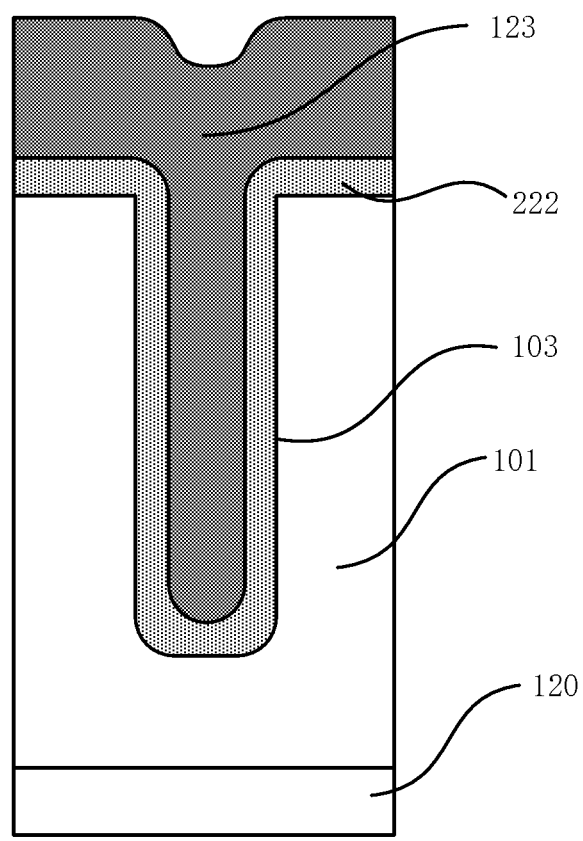

As shown in FIG. 2B, insulating layer 222 may be formed on the internal surface of trench 103 and the upper surface of epitaxial layer 101. First conductor 123 can be formed to fill up trench 103 and to cover the upper surface of epitaxial layer 101. Insulating layer 222 may separate first conductor 123 from epitaxial layer 101. Also, insulating layer 102 and first conductor 123 may each extend to the upper surface of epitaxial layer 101. Insulating layer 102 can include oxide and/or nitride (e.g., silicon oxide, silicon nitride, etc.), and first conductor 123 can include doped polysilicon.

Figure 2C:
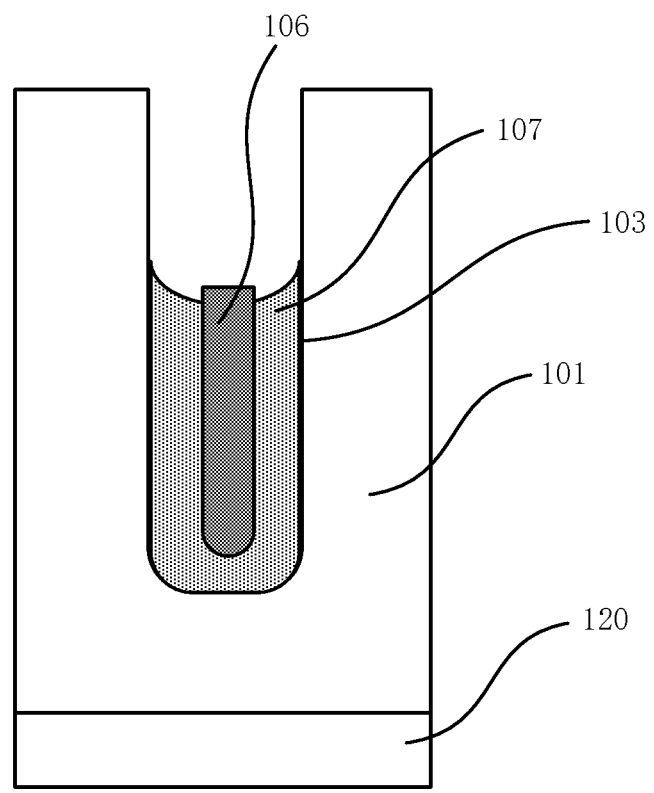

As shown in FIG. 2C, first conductor 123 may be polished by a chemical mechanical polishing process (CMP). Then, first conductor 123 can be selectively etched back relative to insulating layer 222 such that first conductor 123 on the upper surface of epitaxial layer 101 and occupying an upper portion of the trench may be removed to form shield conductor 106. For example, the etching back can be performed by a dry etching process. Insulating layer 102 on the upper surface of epitaxial layer 101 and occupying the upper portion of the trench may be removed to form first insulating layer 107, such that first insulating layer 107 is located between sidewalls of trench 103 and shield conductor 106, and first insulating layer 107 does not cover the top surface of shield conductor 106. For example, the upper surface of first insulating layer 107 may be lower than the top surface of shield conductor 106. The etching process may also be wet etching (e.g., using diluted hydrochloric acid).

Figure 2D:
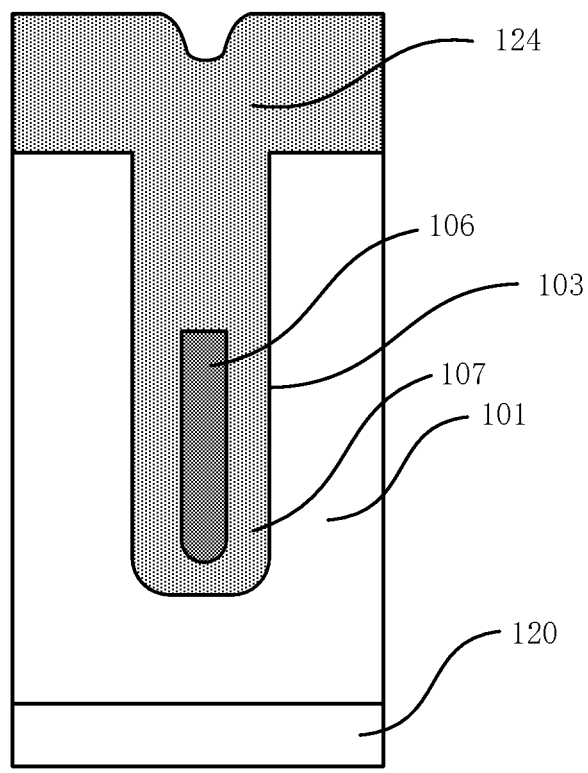

As shown in FIG. 2D, insulating layer 124 can be formed on the top portion of shield conductor 106 and first insulating layer 107, such as by a low pressure chemical vapor deposition (CVD) process or a plasma enhanced chemical vapor deposition process. Insulating layer 124 can cover the top portion of shield conductor 106 and first insulating layer 107, and may be located on sidewalls of the upper portion of trench 103 and the upper surface of epitaxial layer 101. Insulation layer 124 can include oxide and/or nitride (e.g., silicon oxide, silicon nitride, etc.).

Figure 2E:
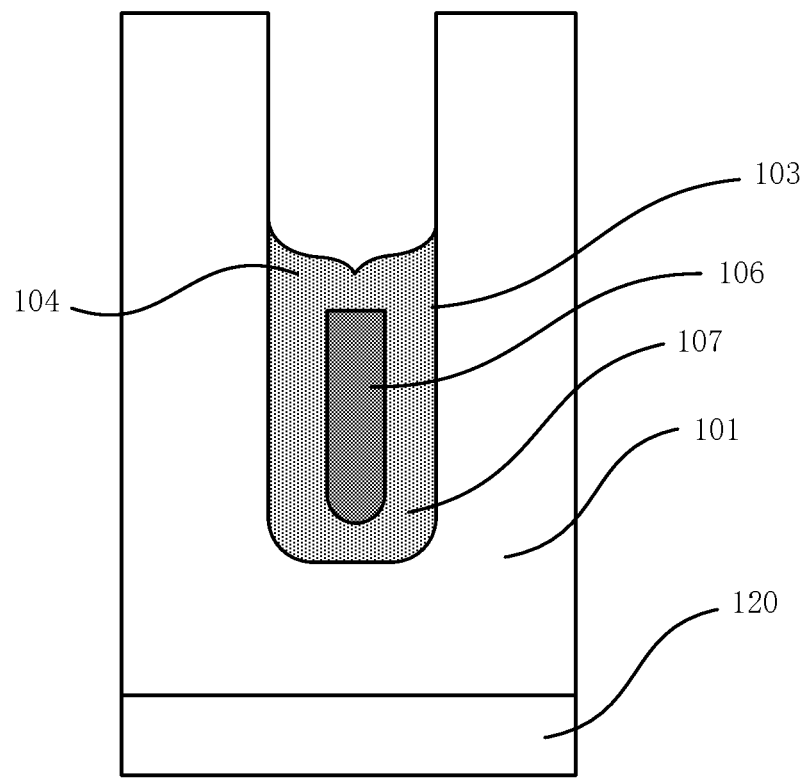

As shown in FIG. 2E, insulating layer 124 can be chemically and mechanically polished, and then insulating layer 124 may be selectively etched back such that insulating layer 124 on the upper surface of epitaxial layer 101 and occupying an upper portion of trench 103 can be removed to form second insulating layer 104. Second insulating layer 104 may be located between shield conductor 106 and a gate conductor formed in a subsequent process. The etch-back can be performed by, e.g., dry etching.

Figure 2F:
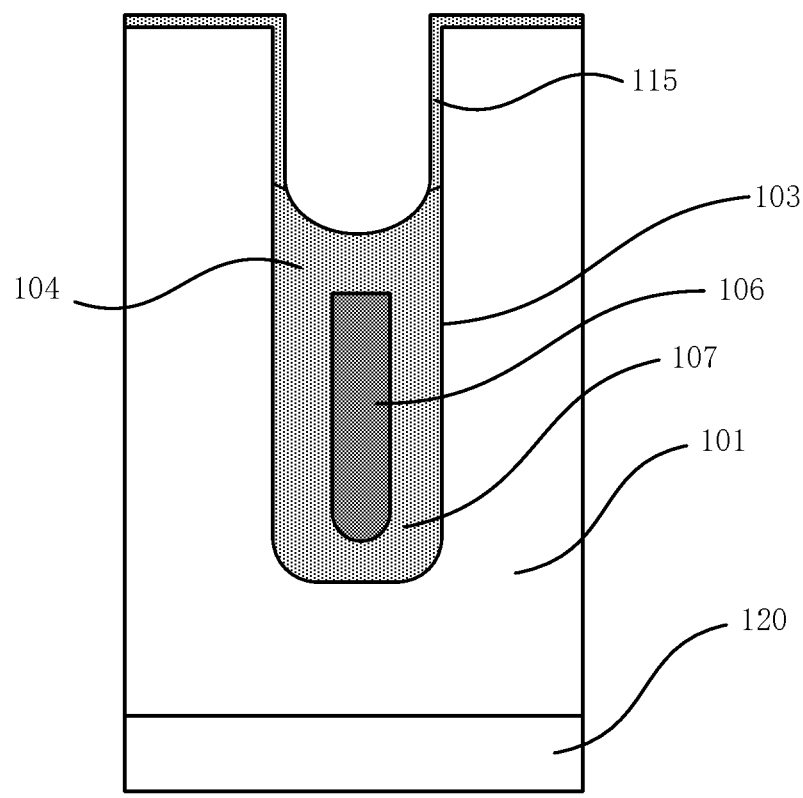

As shown in FIG. 2F, an oxide layer can be formed on sidewall surfaces of the upper portion of the trench, such that sidewalls the trench are covered by gate dielectric layer 115. Gate dielectric layer 115 may be formed by a thermal oxidation process. A thermal oxidation process can generally be used to react silicon with gases containing oxides (e.g., water vapor and oxygen) at high temperatures, in order to produce a dense layer of silicon dioxide ($SiO_2$) film on the surface of silicon wafer.

Figure 2G:
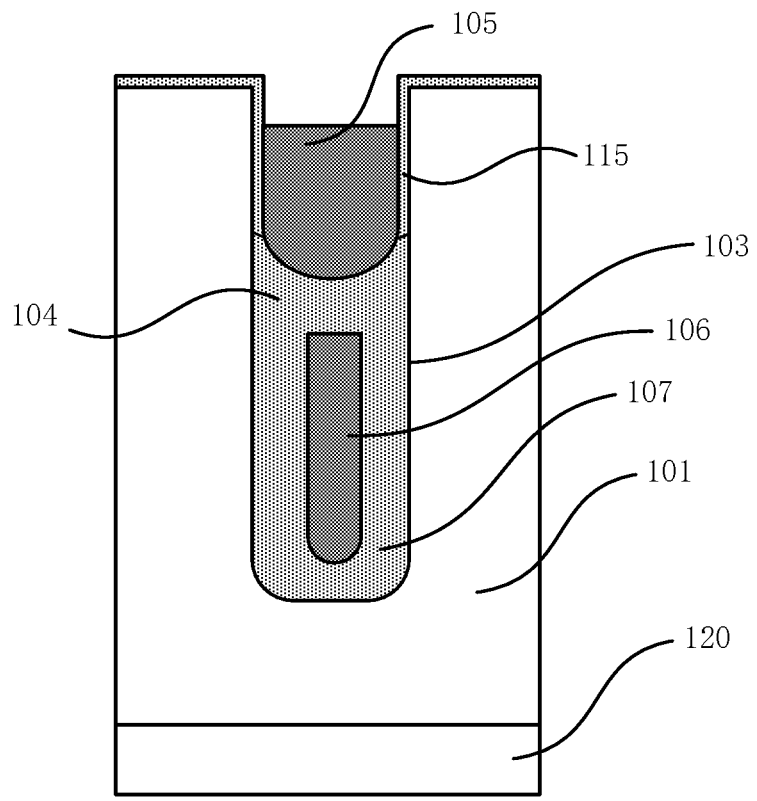

As shown in FIG. 2G, a second conductor can fill up trench 103 covered with gate dielectric layer 104. Second conductor can include a first portion inside trench 103 and a second portion on the upper surface of epitaxial layer 101. Here, the second conductor can be doped polysilicon. The second portion of the second conductor on the upper surface of epitaxial layer 101 may be removed by etching back or chemical mechanical planarization process. Further, the first portion of the second conductor can be selectively removed with respect to gate dielectric layer 115 to form gate conductor 105. The second conductor can be etched back so that part of gate dielectric layer 115 located on the top sidewalls of trench 103 is exposed. That is, the top surface gate conductor 105 may be lower than the upper surface of epitaxial layer 101 to ensure that there is no residual of the gate conductor on the upper surface of the epitaxial layer. The retained second insulating layer 104 may insulate shield conductor 106 and gate conductor 105, and the retained second insulating layer 104 may have a specific mass and thickness to support a potential difference that could exist between shield conductor 106 and gate conductor 105.

Dry etching is a technique of performing plasma etching of thin films. When a gas exists in the form of a plasma, it has two characteristics. On one hand, the chemical activity of these gases in the plasma is much stronger than in the normal state, so by choosing the appropriate gas according to the different materials to be etched, it can react with the material faster in order to achieve the purpose of etching removal. On the other hand, the electric field can be used to guide and may accelerate the plasma to have a certain energy, and when it bombards the surface of the object to be etched, the atoms of the material are shot out to achieve the purpose of etching using physical energy transfer. Therefore, dry etching is the result of a balance between physical and chemical processes on the wafer surface.

Figure 2H:
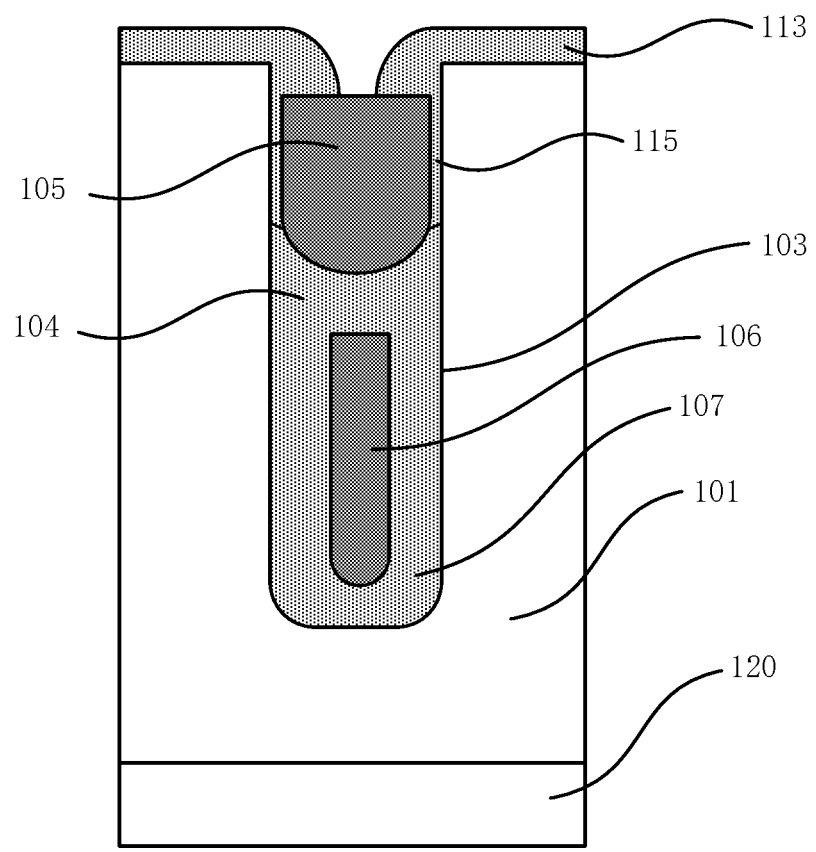

As shown in FIG. 2H, third insulating layer 113 can be formed on the top surface of gate conductor 105 and gate dielectric layer 115. Third insulating layer 113 may include an oxide and/or a nitride or other insulating materials. Here, third insulating layer 113 may be located on the top surface of gate conductor 105 and the upper surface of epitaxial layer 101. In this example, third insulating layer 113 can be formed by a deposition process. Because of the deposition process, third insulating layer 113 may be located on a region of the top surface of gate conductor 105 adjacent to the sidewalls of trench 103, and a slit can be formed in a region far from the sidewalls of trench 103. That is, a region of the top surface of gate conductor 105 away from the trench sidewalls may be exposed. In other examples, third insulating layer 113 may cover part or all of the top surface of gate conductor 105. For example, third insulating layer 113 may be a tetraethyl orthosilicate oxide layer deposited using a tetraethyl orthosilicate decomposition system. During the deposition process, the substrate impurities may be prevented from diffusing outward.

Figure 2I:
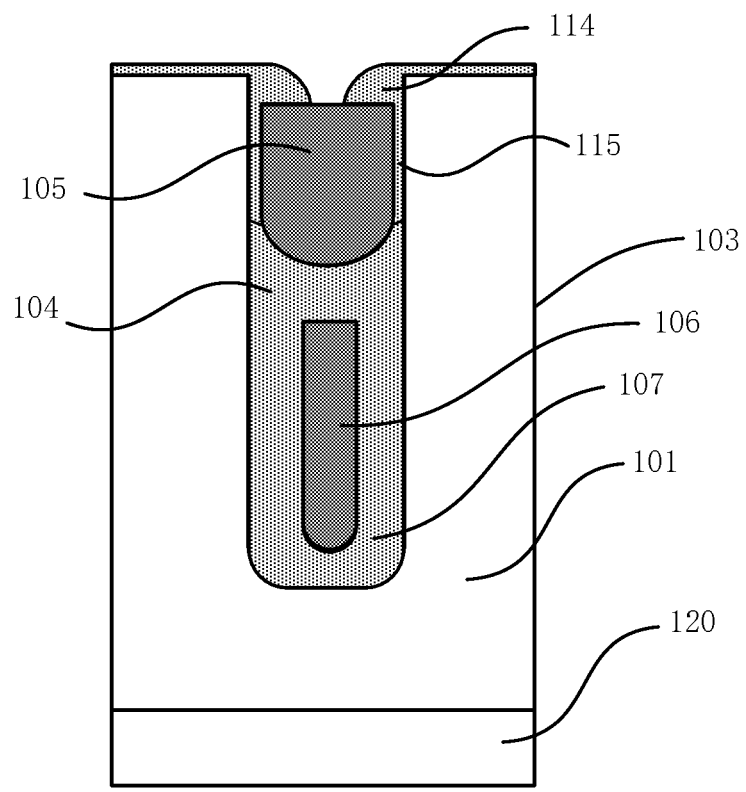

As shown in FIG. 2I, third insulating layer 113 can be etched to form the blocking region 114. The etching process may be, e.g., dry etching, which is anisotropic etching. Third insulating layer can be selectively etched to expose the gate dielectric layer on the upper surface of the epitaxial layer, so as to ensure the normal implantation of the subsequent ion implantation process. The depth of the etching can be controlled by controlling the rate and time of the etching. In this example, the third insulating layer located on the upper surface of the epitaxial layer can be completely etched, such that a gate dielectric layer is retained during the ion implantation process to protect the surface of the epitaxial layer. However, in other examples, due to process reasons, a third insulating layer may remain on the surface of the gate dielectric layer or a portion of the gate dielectric layer is further etched.

After the etching process, the third insulating layer on top of the gate conductor may be blocking region 114, which can prevent impurities from entering epitaxial layer 101 from the sidewalls of trench 103 during ion implantation. Blocking region 114 may be a conformal layer. The thickness of blocking region 114 in trench 103 near the sidewalls of trench 103 can be greater than the thickness of blocking region 114 away from the sidewalls of trench 103. The maximum thickness of blocking region 114 in trench 103 and a distance from the upper surface of epitaxial layer 101 to the top surface of gate conductor 105 can be equal. Here, the thickness of blocking region 114 may be related to the etch-back depth of gate conductor 105, so as to avoid the impurities injected into epitaxial layer 101 from sidewalls of trench 103 during the subsequent formation of the body region, such that the depth of the body region is not affected by the etch-back depth of gate conductor 105, and thus the performance of MOSFET device is not affected.

Figure 2J:
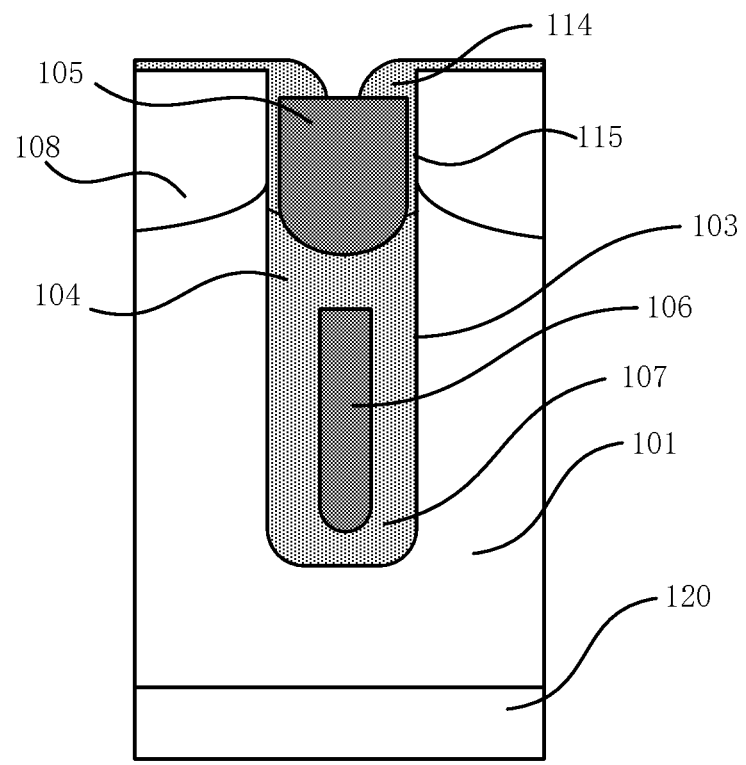

As shown in FIG. 2J, a first ion implantation and driving technique may be performed to form body region 108 of a second doping type in the upper region of epitaxial layer 101 adjacent to the trench.

Further, as shown in FIG. 1, a second ion implantation can be performed to form source region 109 of the first doping type in body region 108. The desired doping depth and doping concentration can be achieved by controlling the parameters of the ion implantation, such as the implantation energy and implantation dose. The lateral extension of body region 111 and source region 113 can be controlled using an additional photoresist mask. For example, body region 108 and source region 109 may be adjacent to the trench, and respectively separated into two portions by gate conductor 105 and gate dielectric 115.

In addition, interlayer dielectric layer 111 located on source region 109 and gate conductor 105 can be formed, and chemical mechanical planarization may further be performed as necessary in order to obtain a flat surface. Interlayer dielectric layer 111 can cover the top surface of source region 109 and gate conductor 105. Further, before interlayer dielectric layer 111 is formed, the blocking region may be removed or not removed. Contact hole penetrating interlayer dielectric layer 111 reaching body contact region 110 may be formed, and body contact region 110 of the second doping type may be formed in body region 108 by the contact hole, such as by the above-described etching process and an ion implantation process. A conductive material may then be deposited in the contact hole to form conductive channel 112. The conductive material can generally include titanium, titanium nitride, tungsten, and the like. Source electrode 122 can be formed on interlayer dielectric layer 111, and source electrode 122 may connect to body contact region 110 via conductive channel 112. Drain electrode 121 can be formed on the lower surface of semiconductor substrate 120 thinned by a thinning technique.

In the above example, conductive channel 112, source electrode 122, gate conductor 105, shield conductor 106, and drain electrode 121 may be formed by a conductive material, such as a metal material (e.g., an aluminum alloy, copper, etc.). In the above example, the above-mentioned oxidation method for forming the oxide layer may be utilized, such as thermal oxidation and deposition may be adopted.

The embodiments were chosen and described in order to best explain the principles of the invention and its practical applications, to thereby enable others skilled in the art to best utilize the invention and various embodiments with modifications as are suited to particular use(s) contemplated. It is intended that the scope of the invention be defined by the claims appended hereto and their equivalents.

What is claimed is:

1. A method of manufacturing a trench metal-oxide-semiconductor field-effect transistor (MOSFET), the method comprising:
    a) forming a trench extending from an upper surface of a base layer to an internal portion of said base layer;
    b) forming a first insulating layer and a shield conductor occupying a lower portion of said trench;
    c) forming a gate conductor occupying an upper portion of said trench and a gate dielectric layer located between the gate conductor and the sidewalls of the trench, wherein a top surface of said gate conductor is lower than an orifice of the trench;
    d) forming a blocking region extending from the top surface of the gate conductor to the upper surface of the base layer at the orifice of the trench to prevent impurities from being implanted into said base layer from said sidewalls of said trench during subsequent ion implantation, wherein a thickness of said blocking region varies in a range from the upper surface of the base layer to the top surface of the gate conductor, and wherein at least a portion of the blocking region is stacked on the top surface of the gate conductor; and
    e) forming a body region in an upper region of said base layer adjacent to the trench, wherein said body region comprises a first doping type.

2. The method of claim 1, wherein said forming said blocking region comprises:
    a) forming a third insulating layer on the top surface of the gate conductor and the gate dielectric layer; and
    b) etching said third insulating layer to form said blocking region located on the top surface of said gate conductor adjacent to sidewalls of said trench.

3. The method of claim 2, wherein said third insulating layer comprises a tetraethyl orthosilicate oxide layer.

4. The method of claim 1, wherein said thickness of said blocking region located at said sidewalls near the orifice of the trench is greater than said thickness of said blocking region at a center top of the trench.

5. The method of claim 4, wherein a maximum thickness of said blocking region is equal to a distance from said upper surface of said base layer to said top surface of said gate conductor.

6. The method of claim 1, further comprises forming a second insulating layer located between said shield conductor and said gate conductor.

7. The method of claim 6, wherein said forming said gate conductor comprises:
    a) filling a conductor layer on said second insulating layer in said trench, wherein said conductor layer comprises a first portion located in said trench and a second portion located on said upper surface of said base layer; and
    b) etching back said conductor layer to form said gate conductor.

8. The method of claim 7, further comprising removing at least said second portion of said conductor layer to form said gate conductor.

9. The method of claim 1, wherein each of said shield conductor and said gate conductor comprises polysilicon.

10. The method of claim 1, wherein said first insulating layer is located on lower sidewall surfaces and a bottom surface of said trench and separates said shield conductor from said base layer.

11. The method of claim 6, wherein said forming said second insulating layer comprises:
    a) forming an insulating layer covering a top surface of said shield conductor and a first insulating layer; and
    b) performing chemical mechanical polishing process and etching process on said insulating layer to form said second insulating layer.

12. The method of claim 11, wherein said forming said second insulating layer comprises a high-density plasma chemical vapor deposition process.

13. The method of claim 2, wherein said etching process comprises a dry etching process.

14. The method of claim 1, wherein said gate dielectric layer is located on upper sidewall surfaces of said trench and separates said gate conductor from said base layer.

15. The method of claim 1, further comprising: a) forming a source region having a second doping type in said body region, wherein said second doping type is opposite to said first doping type; and b) forming an electrode region on a lower surface of said base layer, wherein said upper surface of said base layer and said lower surface of said base layer are opposite to each other.

16. The method of claim 15, further comprising, after the formation of said source region, forming a body contact region having said first doping type in said body region.

17. The method of claim 16, further comprising:
    a) forming an interlayer dielectric layer on said source region and said gate conductor;
    b) forming a conductive channel penetrating said interlayer dielectric layer and said source region to said body contact region; and
    c) forming a source electrode on said interlayer dielectric layer, wherein said source electrode is connected to said body contact region via said conductive channel.

18. The method of claim 1, wherein said base layer comprises a semiconductor substrate and an epitaxial layer having said first doped type formed on said semiconductor substrate.

19. A trench metal-oxide-semiconductor field-effect transistor (MOSFET), comprising:
    a) a base layer;
    b) a trench extending from an upper surface of said base layer to an internal portion of said base layer;
    c) a first insulating layer and a shield conductor occupying a lower portion of said trench;
    d) a gate conductor occupying an upper portion of said trench, and a gate dielectric layer located between the gate conductor and sidewalls of the trench, wherein a top surface of said gate conductor is flat and is configured to be lower than an orifice of the trench;
    e) a blocking region, extending from the top surface of the gate conductor to the upper surface of the base layer at the orifice of the trench, to prevent impurities from being implanted into said base layer from said sidewalls of said trench during subsequent ion implantation, wherein a thickness of said blocking region varies in a range from the upper surface of the base layer to the top surface of the gate conductor, and wherein at least a portion of the blocking region is stacked on the top surface of the gate conductor; and
    f) a body region having a first doping type formed in an upper region of said base layer adjacent to the trench.

* * * * *